US 7,821,055 B2

(12) United States Patent
Loiko et al.

(10) Patent No.: US 7,821,055 B2
(45) Date of Patent: Oct. 26, 2010

(54) STRESSED SEMICONDUCTOR DEVICE AND METHOD FOR MAKING

(75) Inventors: Konstantin V. Loiko, Austin, TX (US); Cheong M. Hong, Austin, TX (US); Sung-Taeg Kang, Austin, TX (US); Taras A. Kirichenko, Austin, TX (US); Brian A. Winstead, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/414,763

(22) Filed: Mar. 31, 2009

(65) Prior Publication Data

US 2010/0244121 A1    Sep. 30, 2010

(51) Int. Cl.
*H01L 29/788* (2006.01)
*H01L 29/792* (2006.01)

(52) U.S. Cl. .............. 257/316; 257/325; 257/326; 257/E29.3; 257/E21.179; 438/267; 438/283; 438/287

(58) Field of Classification Search ............ 438/267, 438/FOR. 212, 593, FOR. 189; 257/316, 257/E29.3, E21.179
See application file for complete search history.

(56) References Cited

U.S. PATENT DOCUMENTS

| 5,408,115 | A | 4/1995 | Chang | |
|---|---|---|---|---|
| 6,875,660 | B2 * | 4/2005 | Hung et al. | 438/279 |
| 7,235,441 | B2 * | 6/2007 | Yasui et al. | 438/257 |
| 7,436,019 | B2 * | 10/2008 | Lutze et al. | 257/315 |
| 7,446,370 | B2 * | 11/2008 | Chang et al. | 257/316 |
| 7,494,860 | B2 * | 2/2009 | Mokhlesi | 438/201 |
| 7,557,402 | B2 * | 7/2009 | Shyu et al. | 257/314 |
| 2005/0104115 | A1 * | 5/2005 | Kianian | 257/314 |
| 2007/0132054 | A1 | 6/2007 | Arghavani et al. | |
| 2008/0042183 | A1 * | 2/2008 | Mokhlesi | 257/314 |
| 2008/0261385 | A1 | 10/2008 | Jawarani et al. | |
| 2009/0004796 | A1 * | 1/2009 | Chang et al. | 438/264 |

OTHER PUBLICATIONS

Arghavani et al; "Strain Engineering to Improve Data Retention Time in Non-Volatile memory"; IEEE Transactions on Electron Devices, vol. 54, No. 2, Feb. 2007.
Ortolland et al; "Stress Memorization Technique (SMT) Optimization for 45nm CMOS"; 2006 Symposium on VLSI Technology, 2006. Digest of Technical Papers. pp. 78-79.

(Continued)

*Primary Examiner*—George Fourson
(74) *Attorney, Agent, or Firm*—Daniel D. Hill; James L. Clingan, Jr.

(57) ABSTRACT

A method of making a semiconductor device on a semiconductor layer includes forming a gate dielectric and a first layer of gate material over the gate dielectric. The first layer is etched to remove a portion of the first layer of gate material over a first portion of the semiconductor layer and to leave a select gate portion. A storage layer is formed over the select gate portion and over the first portion of the semiconductor layer. A second layer of gate material is formed over the storage layer. The second layer of gate material is etched to remove a first portion of the second layer of gate material over a first portion of the select gate portion. A portion of the first portion of the select gate is etched out to leave an L-shaped select structure. The result is a memory cell with an L-shaped select gate.

20 Claims, 7 Drawing Sheets

OTHER PUBLICATIONS

Ferri et al; "Influence of film thickness on the crystallization of Ni-doped amorphous silicon samples"; Journal of Applied Physics, vol. 104, 2008.

Zanatta et al; "Crystallization, stress, and stress-relieve due to nickel in amorphous silicon thin films"; Journal of Applied Physics, vol. 102, 2007.

* cited by examiner

STRESSED SEMICONDUCTOR DEVICE AND METHOD FOR MAKING

CROSS-REFERENCE TO RELATED APPLICATION(S)

This application is related to Ser. No. 12/414,778, filed on even date, entitled "Method For Making A Stressed Non-Volatile Memory Device", by Loiko et al., and assigned to the current assignee hereof.

BACKGROUND

1. Field

This disclosure relates generally to semiconductors, and more specifically, to a stressed semiconductor device method for making.

2. Related Art

Semiconductor non-volatile memories (NVMs), and particularly flash electrically erasable, programmable read-only memories (EEPROMs), are widely used in a range of electronic equipment from computers, to telecommunications hardware, to consumer appliances. The flash EEPROM is encountered in numerous configurations. In particular, a floating-gate NVM cell is characterized by a stacked gate construction in which a floating gate, typically formed from polysilicon, is separated from the substrate by a first (lower) oxide layer and is separated from a polysilicon control gate by a second (upper) oxide layer. No direct electrical connection is made to the floating gate (hence, "floating").

In another configuration, a charge storage layer comprising nanocrystals as the charge storage mechanism is used in place of the floating gate. The nanocrystals function as isolated charge storage elements.

In many prior art non-volatile memory (NVM) devices, the charge storage layer is separated from the channel region by a relatively thin tunnel dielectric layer. There can be a problem of charge leakage from the charge storage layer to the underlying channel. Such charge leakage can lead to degradation of the memory state stored within the device and is therefore undesirable. In order to avoid such charge leakage, the thickness of the tunnel dielectric is often increased. However, a thicker tunnel dielectric requires higher programming and erasing voltages for storing and removing charge from the charge storage layer as the charge carriers must pass through the thicker tunnel dielectric. In many cases, higher programming voltages increase power consumption and may require the implementation of charge pumps in order to increase the supply voltage to meet programming voltage requirements. Such charge pumps consume a significant amount of die area for the integrated circuit and therefore reduce the memory array area efficiency and increase overall costs.

Therefore, what is needed is a NVM cell that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
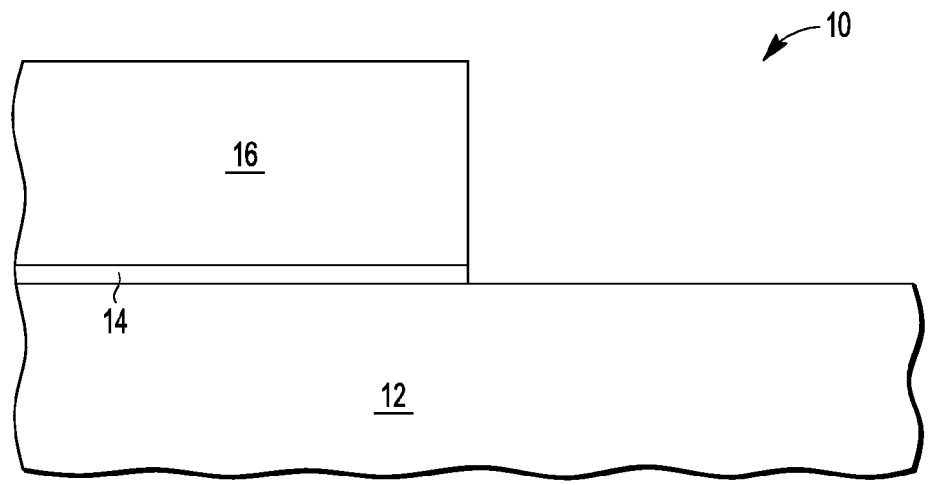
FIGS. 1-8 illustrate, in cross-section, steps for the fabrication of an NVM device in accordance with an embodiment.

Generally, there is provided, a split-gate NVM cell having a tensile stressor layer for providing a stress to the charge storage layer and to the channel region under the control gate of a split-gate NVM cell. In the illustrated embodiment, the stressor layer is a nitride etch-stop layer for providing a longitudinal tensile stress along the channel direction and for providing a vertical compressive stress perpendicular to the channel direction. The stresses are applied to the charge storage layer under the control gate and in the channel region under the control gate. The stress changes the energy barrier height between the bottom insulator and the nanocrystals of the charge storage layer gate. The stress may also increase the effective mass in the nanocrystals of the charge storage layer. The higher energy barrier and increased effective mass improve data retention of the nanocrystals by reducing a leakage current from the charge storage layer to the channel region.

In one aspect, there is provided, a method of making a semiconductor device on a semiconductor layer, comprising: forming a gate dielectric over the semiconductor layer; forming a first layer of gate material over the gate dielectric; etching the first layer of gate material to remove a portion of the first layer of gate material over a first portion of the semiconductor layer and to leave a select gate portion; forming a storage layer over the select gate portion and over the first portion of the semiconductor layer; forming a second layer of gate material over the storage layer; etching the second layer of gate material to remove a first portion of the second layer of gate material over a first portion of the select gate portion; and etching out a portion of the first portion of the select gate portion to leave an L-shaped select gate structure, wherein: the L-shaped select gate structure has a vertical portion and a horizontal portion; the vertical portion has a height and a width; and the horizontal portion has a thickness that is less than the height of the vertical portion. The step of etching out is further characterized by the thickness of the horizontal layer being sufficiently thick to have implant blocking capability sufficient to prevent implants during the step of implanting if the implants are received directly by the horizontal layer. The step of etching out may further comprise removing a portion of the storage layer over the first portion of the select gate structure. The step of etching the second layer may be further characterized as leaving a second portion of the second layer over the vertical portion and a third portion of the second layer over the first portion of the semiconductor layer. The method may further comprise forming a stressor layer over the semiconductor device after the step of etching out. The method may further comprise removing a portion of the horizontal portion of the L-shaped select gate structure to form a select gate comprising the vertical portion and a portion of the horizontal portion prior to the step of forming the stressor layer. The step of etching the second layer of gate material may be further characterized as forming a control gate from the second layer of gate material, the method further comprising implanting to form a first source/drain region in the semiconductor layer adjacent to the select gate and a second source/drain region in the semiconductor layer adjacent to the control gate. The method may further comprise forming a sidewall spacer spanning the portion of the horizontal portion of the select gate to form a mask during at least a portion of the step of implanting. The step of etching out may be further characterized by the thickness of the horizontal portion being less than 60 nanometers. The step of implanting may further include forming sidewall spacers, and the method may further comprise: forming silicide regions at a top surface of the first and second source/drain regions; removing the sidewall spacers; and forming a stressor layer over the select gate, control gate, and first and second source/drain regions. The step of forming the storage layer may be further characterized by the storage layer comprising nanocrystals. The method may further comprise implanting the first layer of gate material with a dopant for use in making the first layer of gate material conductive. The step of etching out is further characterized by the width of the vertical portion being less than 60 nanometers.

In another aspect, there is provided, a semiconductor device, comprising: a gate dielectric over a semiconductor layer; an L-shaped select gate over the gate dielectric having a horizontal portion having a thickness and a vertical portion having a width and a height, the height greater than the thickness; a control gate having a first portion over the vertical portion, a second portion laterally adjacent the vertical portion, and a third portion over the semiconductor layer; and a storage layer between the control gate and the select gate and between the control gate and the semiconductor layer. The semiconductor device may further comprise a stressor layer laterally adjacent to and over the control gate and laterally adjacent to and over the select gate. The semiconductor device may further comprise: a first source/drain in the semiconductor layer adjacent to the horizontal portion of the select gate; and a second source/drain in the semiconductor layer laterally adjacent to the control gate, wherein the stressor layer is over the first and second source/drains. The thickness of the horizontal portion may be sufficiently thick to be able block source/drain implants. In an alternative embodiment, the thickness of the horizontal portion may be less than 60 nanometers.

In yet another embodiment, there is provided, a method of making a semiconductor device on a semiconductor layer, comprising: forming a select gate portion over the semiconductor layer; forming a storage layer having a first portion over the select gate portion and a second portion over the semiconductor layer; forming a control gate structure over the storage layer and having a first portion over a first portion of the select gate portion, a second portion laterally adjacent the select gate portion, and a third portion over the semiconductor layer; removing a portion of the select gate portion to provide a select gate comprising a vertical portion under the first portion of the control gate and a horizontal portion extending away from the control gate, wherein the horizontal portion has a thickness less than a height of the vertical portion; and forming an insulating layer that provides a stress to the semiconductor layer under the control gate and the select gate. The method may further comprise: forming a first source/drain and a second source/drain in the semiconductor layer, wherein the first source/drain is adjacent to the select gate and the second source/drain is adjacent to the control gate.

The semiconductor substrate described herein can be any semiconductor material or combinations of materials, such as gallium arsenide, silicon germanium, silicon-on-insulator (SOI), silicon, monocrystalline silicon, the like, and combinations of the above.

FIGS. 1-8 illustrate, in cross-section, steps for the fabrication of an NVM device in accordance with an embodiment.

FIG. 1 illustrates, in cross-section, a partially completed NVM device 10. In FIG. 1 an insulating layer 14 is grown on a semiconductor substrate 12. In one embodiment, insulating layer 14 is a gate dielectric layer comprising a conventional, thermally formed silicon dioxide or silicon oxynitride with a thickness of preferably less than 10 nanometers. In another embodiment, gate dielectric 14 may comprise an alternative gate material such as a first or second transition metal oxide or rare earth oxide material. Such alternative gate dielectric materials are suitable for their high dielectric constant (K), which enables the use of a thicker gate dielectric layer without adversely affecting the electrical and capacitive characteristics of the film. One preferred high K gate dielectric is hafnium oxide ($HfO_2$). For these alternative gate dielectrics, suitable transition metal oxide composites selected from oxides of zirconium, hafnium, aluminum, lanthanum, strontium, tantalum, titanium, silicon and the combinations thereof may be used. Transition metal silicates and aluminates may also be used for the gate dielectric, such as hafnium silicate ($Hf_xSi_yO_z$) hafnium aluminate ($Hf_xAl_yO_z$). A polysilicon layer 16 is formed over insulating layer 14. Polysilicon layer 16 and insulating layer 14 are etched using a conventional etch process to form a select gate for NVM device 10. Polysilicon layer 16 is a polysilicon layer or a polysilicon-germanium layer which is either in-situ doped or subsequently doped to be sufficiently conductive for, e.g., a gate electrode application. A photoresist layer is formed over polysilicon layer 16 (not shown) and then etched to form a patterned photoresist layer (not shown). Polysilicon layer 16 is then etched in the areas not covered by the photoresist to form the select gate for NVM device 10. In one embodiment, polysilicon layer 16 may be from 60 to 200 nanometers thick.

Figure 2:
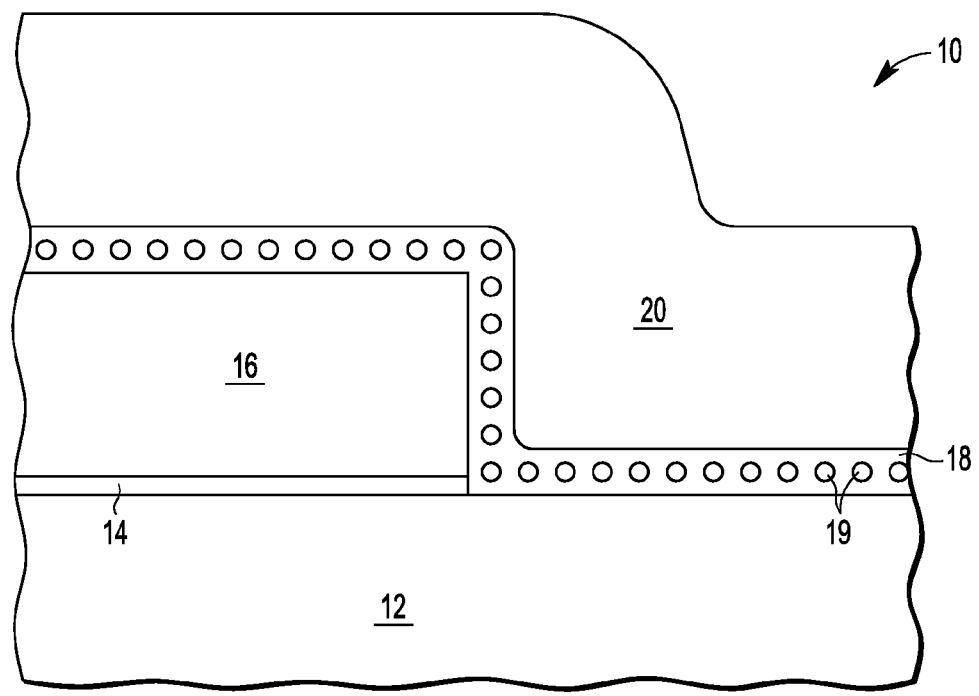

FIG. 2 illustrates, in cross-section, partially completed NVM device 10. In FIG. 2, a charge storage layer 18 is formed over select gate 16 and substrate 12. In one embodiment, nanocrystals 19, represented by the small circles in charge storage layer 18, are used to form a plurality of discrete charge storage elements. These nanocrystals are typically formed of silicon, but the discrete storage elements may also be formed of clusters of material consisting of, for example, of germanium, silicon carbide, any number of metals, or in any combination. Alternately, the charge storage material may consist of nitride, although any number of dielectrics containing traps may be used, such as aluminum oxide, zirconium oxide, hafnium oxide, tantalum oxide, lanthanum oxide, hafnium silicate, or hafnium aluminate. In another embodiment, charge storage layer 18 may be formed from a different material, such as for example, a floating gate formed from polysilicon. A second polysilicon layer 20 is deposited over charge storage layer 18 and doped using ion implantation as appropriate for a gate electrode application. In one embodiment, polysilicon layer 20 may be from 40 to 200 nanometers thick.

Figure 3:
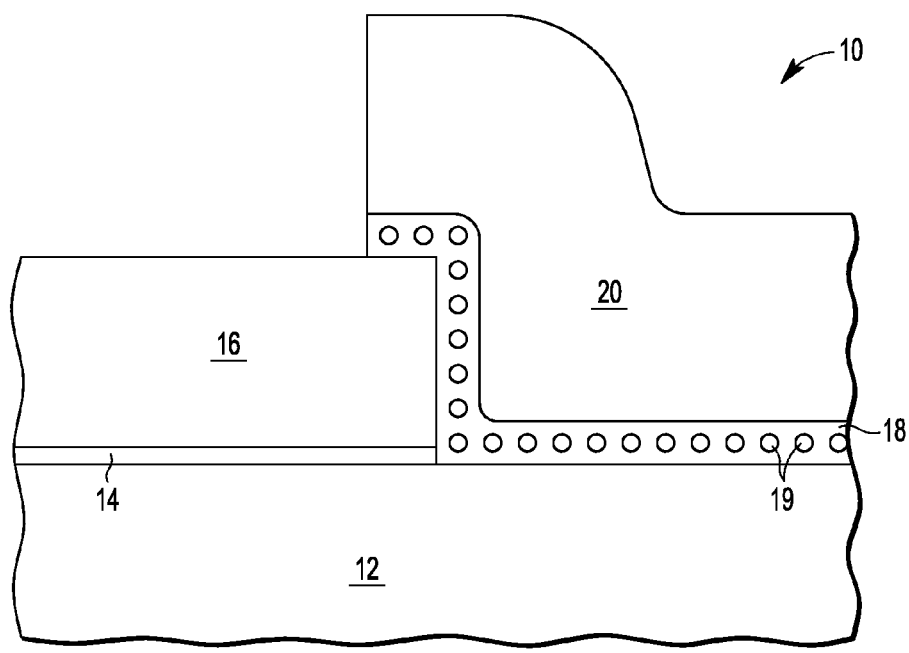

FIG. 3 illustrates, in cross-section, partially completed NVM device 10 after polysilicon layer 20 and charge storage layer 18 are patterned using a first etching step to form a control gate. A photoresist layer (not shown) is formed and patterned. Then polysilicon layer 20 is etched in areas not covered by the photoresist layer. Note the over-lap of the control gate polysilicon 20 and select gate polysilicon 16.

Figure 4:
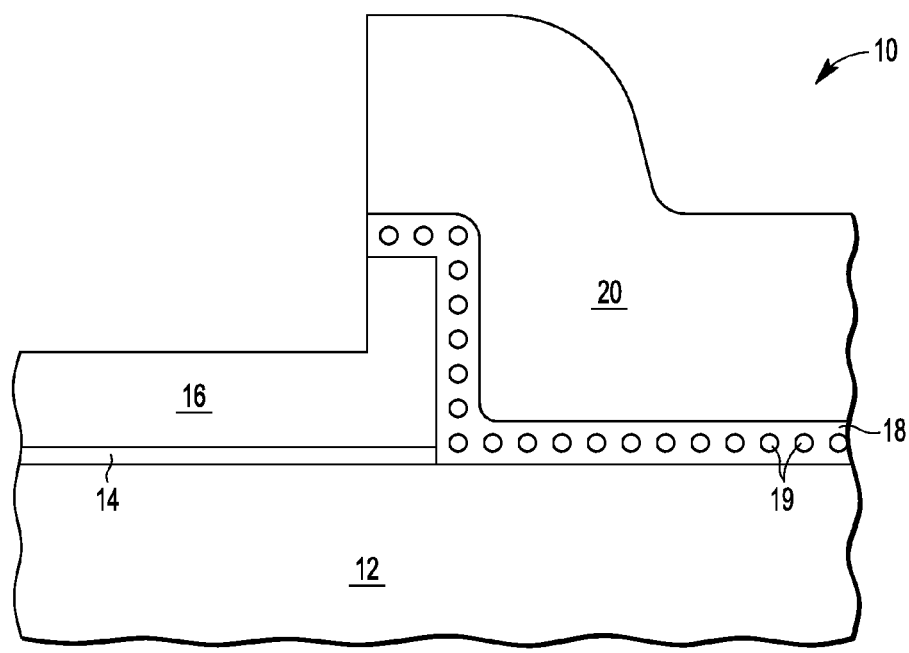

FIG. 4 illustrates, in cross-section, partially completed NVM device 10 after a second etching step is used to form an L-shape in the select gate 16. As can be seen in FIG. 4, not all of polysilicon layer 16 is removed from the uncovered areas. In one embodiment, the etching process is stopped when polysilicon layer 16 has a reduced thickness in the areas not covered by photo resist layer 24.

Figure 5:
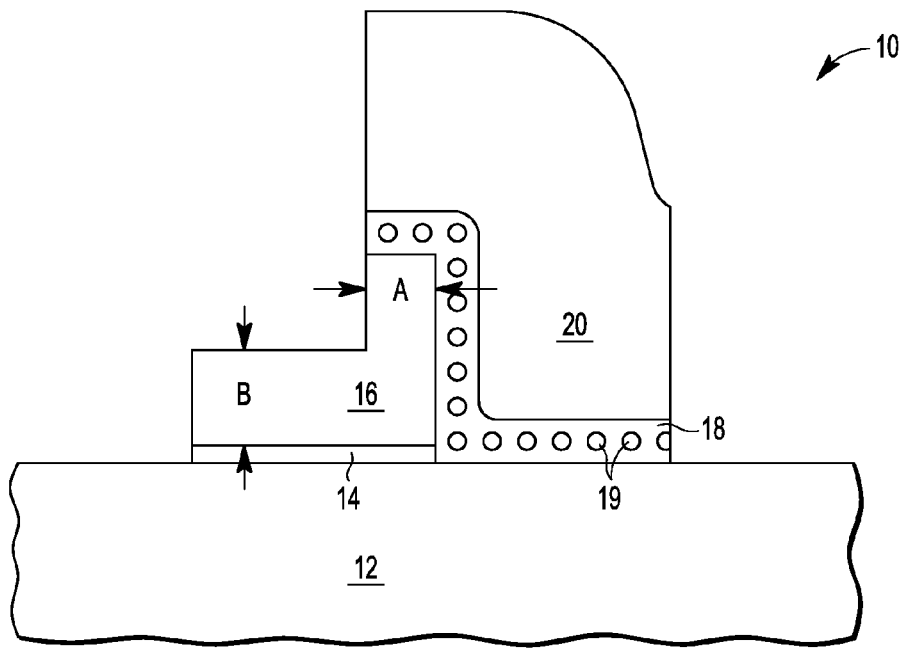

FIG. 5 illustrates, in cross-section, partially completed NVM device 10 after a patterning step to establish a control gate length and select gate length. The control gate length is in the range of 50-250 nanometers and the select gate length is in the range of 50-250 nanometers. In one embodiment, the dimension "A" in FIG. 5 may be in the range of 10-60 nanometers and the dimension "B" may be in the range of 60-100 nanometers. In another embodiment, the dimension B may be less than 60 nanometers. A channel length is equal to about the combination of the control gate length, the thickness of the charge storage layer 18, and the select gate length. Device 10 can be characterized as being a split-gate NVM cell. The split-gate NVM cell typically exhibits two distinguishable channel regions, respectively controllable by the select gate and the control gate.

Figure 6:
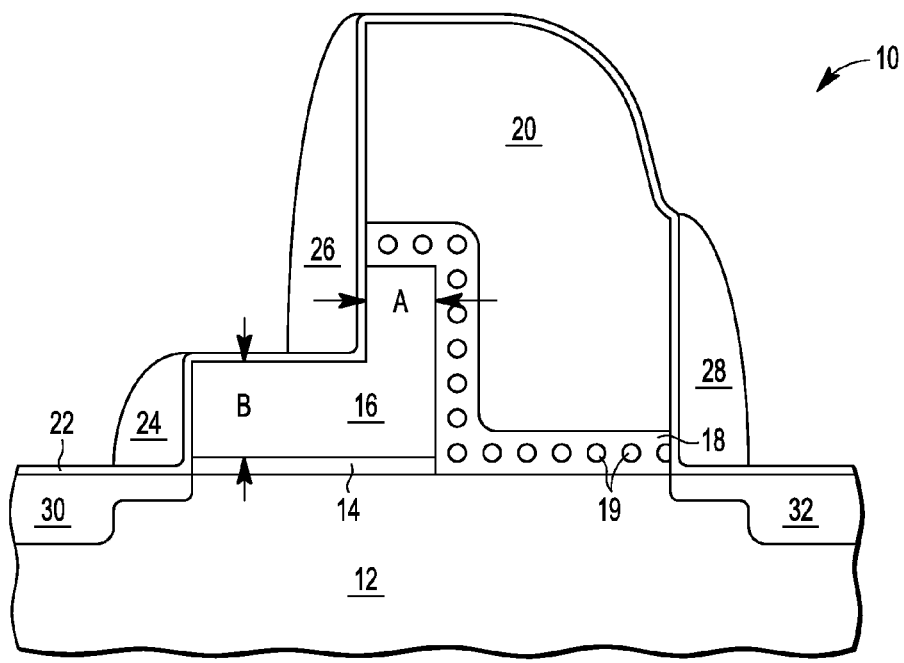

FIG. 6 illustrates, in cross-section, partially completed NVM device 10, where an oxide liner 22 is formed over the structure of NVM device 10, and sidewall spacers 24, 26, and 28 are formed over liner 22. Prior to forming spacers 24, 26, and 28, source/drain extensions are formed in substrate 12. The spacer material is typically nitride, although it may be formed of another material that can be selectively etched. Spacer 24 is formed adjacent to the vertical side of the reduced thickness portion of select gate 16. Spacer 26 is formed on the horizontal leg of select gate 16 and adjacent to the vertical leg of the L-shaped select gate 16 and control gate 20. Spacer 28 is formed adjacent to control gate 20 on a side opposite the select gate. Source/drain regions 30 and 32 are then implanted with a relatively low-energy implant, and device 10 is annealed. In another embodiment, a thickness, dimension B of device 10, is sufficiently thick to have an implant blocking capability to prevent implant penetration directly through the horizontal leg during source/drain implantation.

Figure 7:
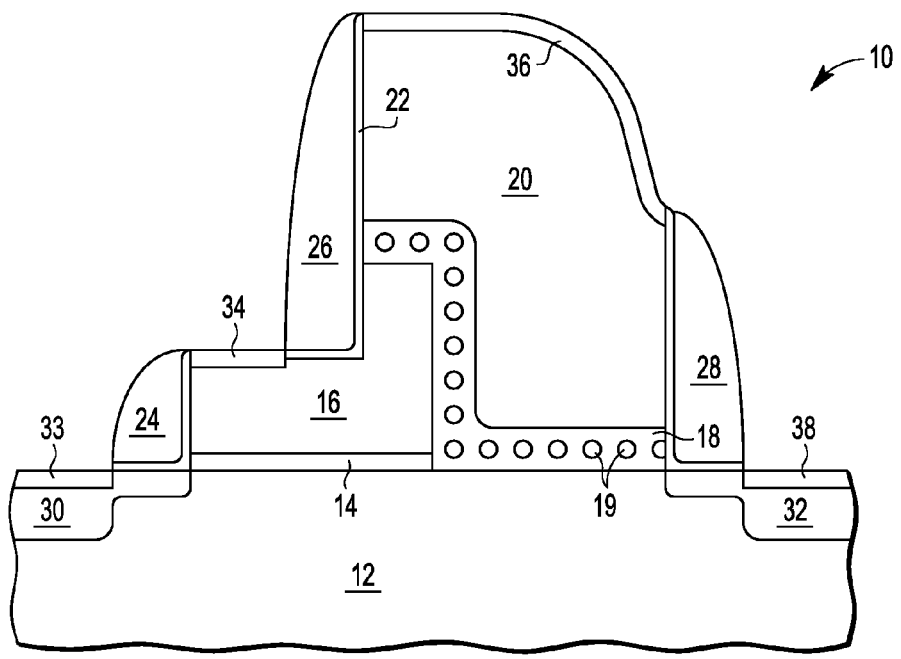

FIG. 7 illustrates, in cross-section, partially completed NVM device 10, where silicided portions 33, 34, 36, and 38 are formed. Silicided portions are formed by depositing a metal such as cobalt, nickel, platinum, or a combination of metals, on the polysilicon and annealing the device. Silicided portions 33 and 38 are at a top surface of source/drain regions 30 and 32, respectively. Silicided portion 34 is at a top surface of the horizontal leg of L-shaped select gate 16. Silicided portion 36 is at a top surface of control gate 20. Alternatively, silicide portion 34 may be blocked from the active region, and only formed in a select gate pad region. Similarly, the silicide portion 36 may be formed only in a control gate pad region. This is done to make it feasible to use very thin polysilicon gates, that is, polysilicon gates that are less than about 30 nanometers, where silicide may spike through to the gate oxide. In one embodiment, forming silicide portions 34 and/or 36 only in the gate pad regions may be accomplished by using a modified resistor protect oxide (RPO) mask pattern.

Figure 8:
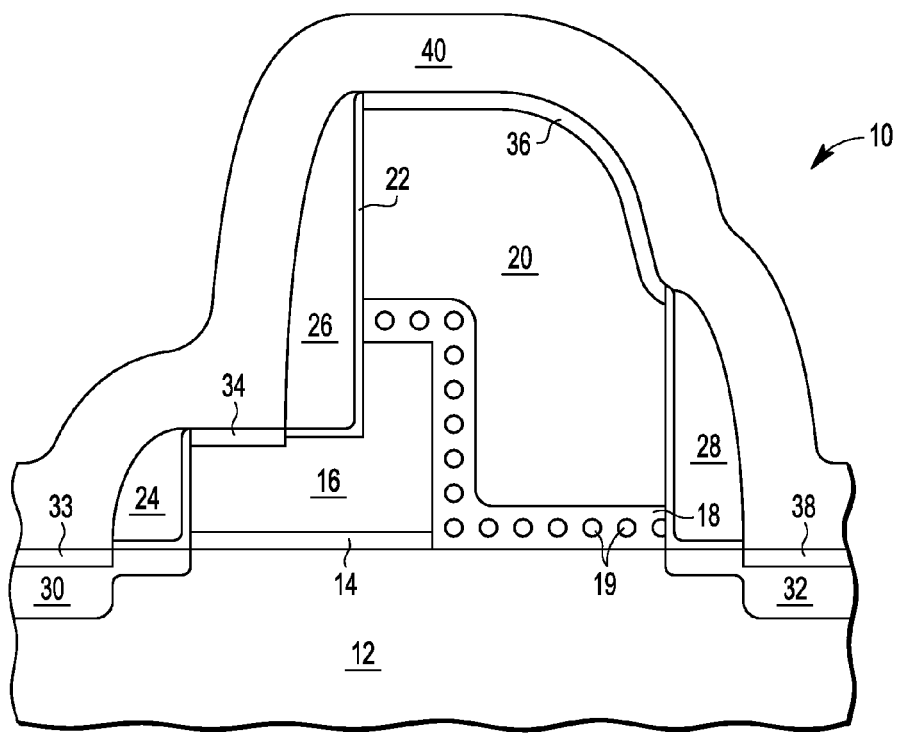

FIG. 8 illustrates, in cross-section, NVM device 10 after a stressor layer 40 is deposited over the device 10. In one embodiment, stressor layer 40 is a tensile nitride etch stop layer. Stressor layer 40 imparts a longitudinal tensile stress along the channel direction and a vertical compressive stress perpendicular to the channel direction. The stresses are applied to the charge storage layer under the control gate and in the channel region under the control gate.

Figure 9:
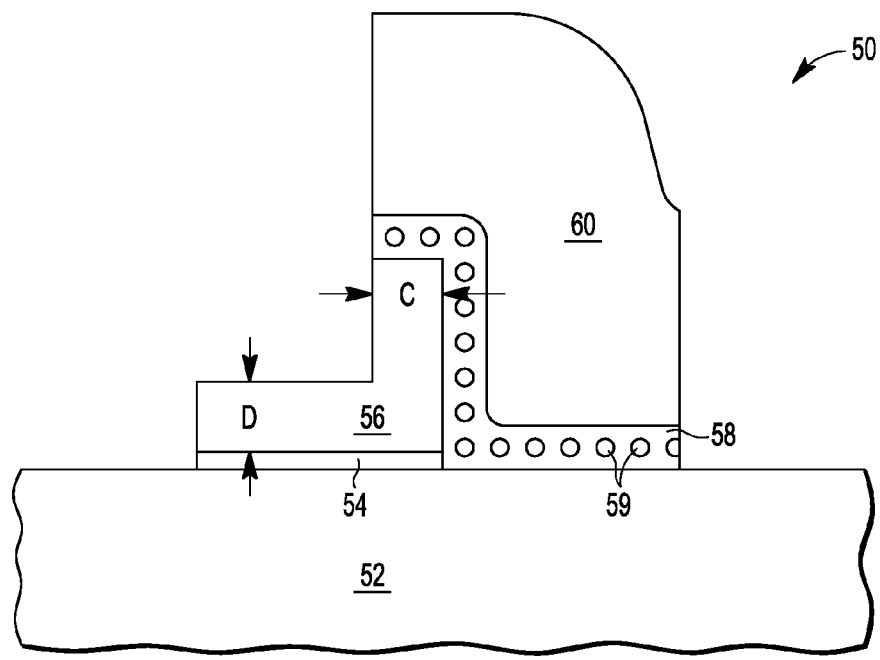
FIGS. 9-14 illustrate, in cross-section, steps for the fabrication of an NVM device in accordance with an embodiment.

FIGS. 9-14 illustrate, in cross-section, steps for the fabrication of NVM device 50 in accordance with another embodiment. Unlike the embodiment of FIGS. 1-8, the embodiment of FIGS. 9-14 uses disposable sidewall spacers. FIG. 9 illustrates a cross section of partially complete device 50 having a semiconductor substrate 52, a gate dielectric layer 54, L-shaped selected gate 56, charge storage layer 58 and control gate 60. Charge storage layer 58 includes nanocrystals 59. Device 50 of FIG. 9 may be fabricated by following the steps detailed above in FIGS. 1-5 except that the dimensions A and B are changed to dimensions C and D. Dimension "C" of L-shaped select gate 56 is in a range of between 10-60 nanometers. Dimension "D" of L-shaped select gate 56 is in a range of between 20-100 nanometers. In the interest of brevity and clarity the steps of FIG. 1 through FIG. 5 will not be described again.

Figure 10:
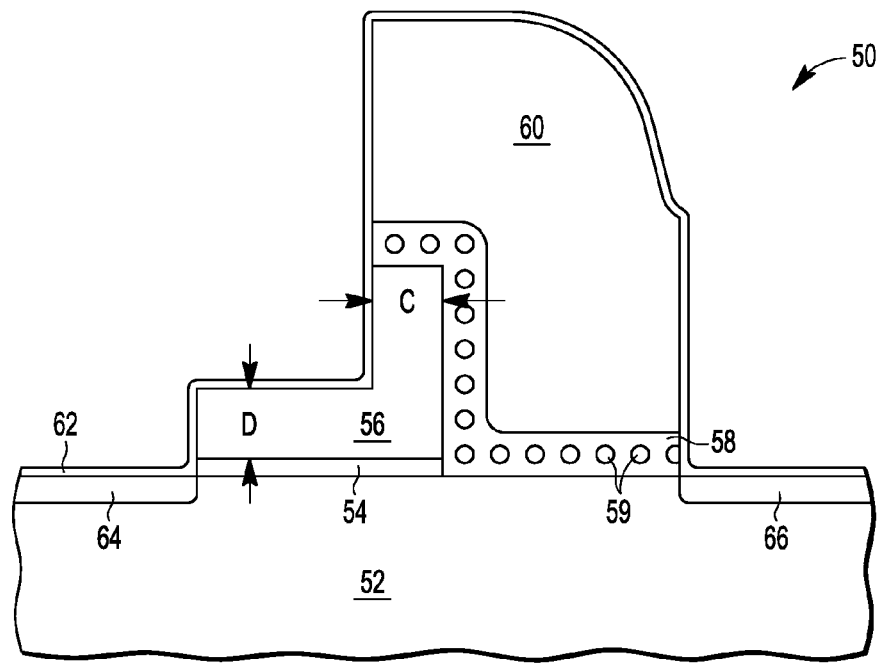

FIG. 10 illustrates, in cross-section, partially completed NVM device 50 after source/drain extensions 64 and 66 are implanted and oxide liner 62 is deposited.

Figure 11:
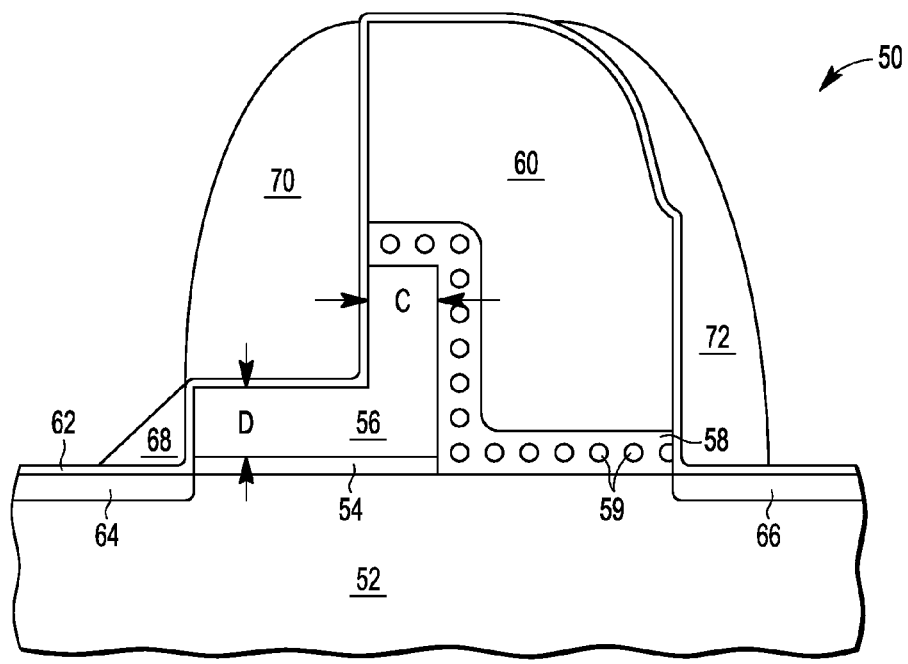

FIG. 11 illustrates, in cross-section, partially completed NVM device 50 following the deposition of sidewall spacers 68, 70, and 72. In the illustrated embodiment, the spacer material is nitride, although it may be formed of another material that can be selectively etched. Spacer 68 is formed on the vertical side of the reduced thickness of select gate 56. Spacer 70 is formed on the horizontal leg of select gate 56 and adjacent to the vertical leg of the L-shaped select gate 56 and the vertical edge of control gate 60 as illustrated in FIG. 11. Spacer 70 spans the horizontal leg of select gate 56. Spacer 72 is formed adjacent to and on control gate 60 on a side opposite of select gate 56.

Figure 12:
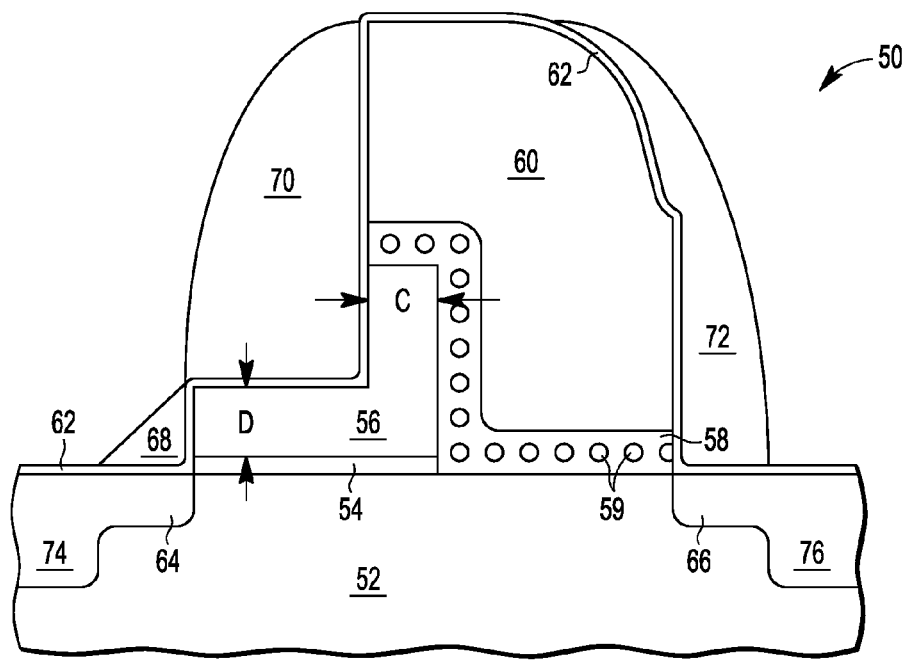

FIG. 12 illustrates, in cross-section, partially completed NVM device 50 after source/drain region 74 and source/drain region 76 are implanted using ion implantation. Note that source/drain region 74 and source/drain region 76 can be relatively deeper than those of the embodiment illustrated in FIG. 6 because the substantially wider spacer 70 on select gate 56 in FIG. 12 covers, or masks, the whole horizontal leg of the select gate and blocks source/drain implant penetration.

Figure 13:
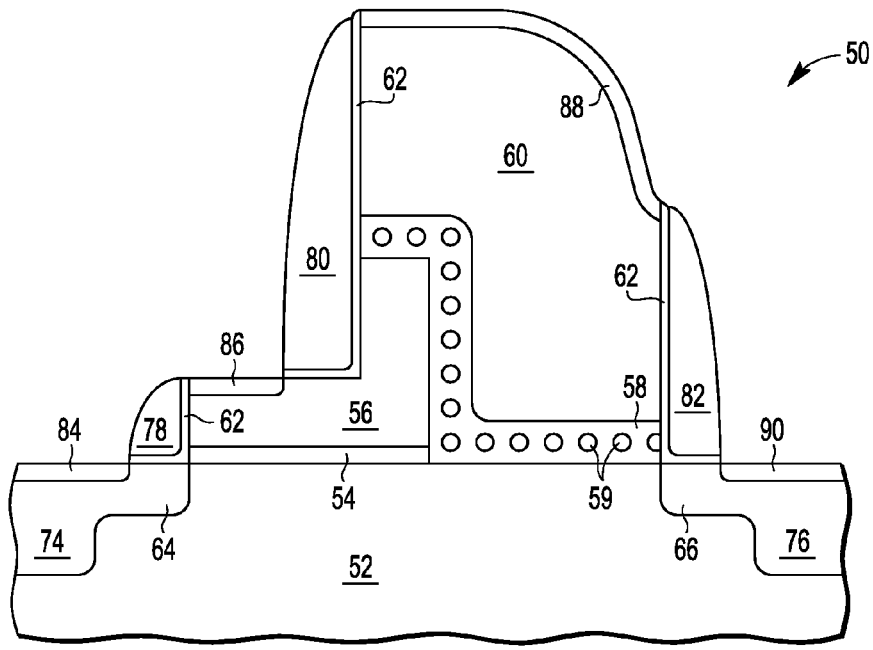

FIG. 13 illustrates, in cross-section, partially completed NVM device 50 after silicide formation. After spacers 68, 70, and 72 are removed, new sidewall spacers 78, 80, and 82 are formed. In the illustrated embodiment, the spacer material is titanium nitride, although it may be formed of silicon nitride or another material that can be selectively etched. Liner 62 is then removed from the areas not covered by spacers 78, 80, and 82. Silicided regions 84, 86, 88, and 90 are formed. As illustrated in FIG. 13, silicided region 84 is formed in source/drain region 74, silicided region 86 is formed in select gate 56, silicided region 88 is formed in control gate 60, and silicided region 90 is formed in source/drain region 76. Alternatively, silicide portion 86 may be blocked from the active region, and only formed in a select gate pad region. Similarly, the silicide portion 88 may be formed only in a control gate pad region. In one embodiment, forming silicide portions 86 and/or 88 only in the gate pad regions may be accomplished by using a modified RPO mask pattern. Spacers 78, 80, and 82 are then removed.

Figure 14:
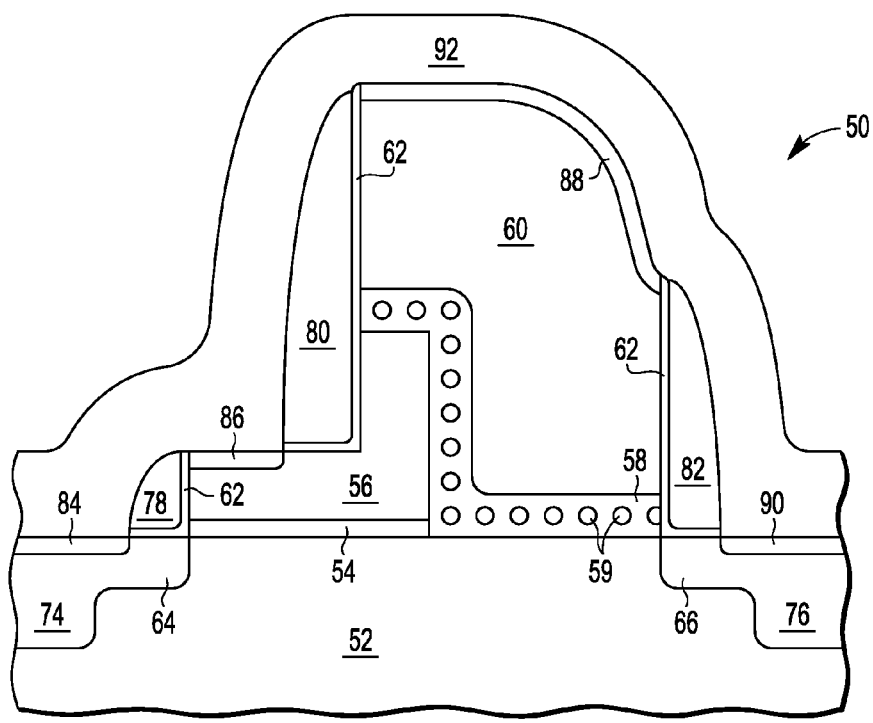

FIG. 14 illustrates, in cross-section, partially completed NVM device 50 after a stressor layer 92 is deposited over device 50. In one embodiment, stressor layer 92 is a tensile nitride etch stop layer. Stressor layer 92 imparts a longitudinal tensile stress along the channel direction and a vertical compressive stress perpendicular to the channel direction. The stresses are applied to the charge storage layer under the control gate and in the channel region under the control gate. In both illustrated embodiments, the stress reduces the leakage current from the charge storage layer to the channel region. Note that even though tensile stress is applied in the illustrated embodiment, in another embodiment compressive stress may be applied. The use of disposable sidewall spacer 70 allows the source/drain regions to be more deeply doped by covering the horizontal portion of L-shaped select gate 56. The removal of spacer 80 allows the stressor layer 92 to be closer to the portion of the charge storage layer 58 under the control gate Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method of making a semiconductor device on a semiconductor layer, comprising:
    forming a gate dielectric over the semiconductor layer;
    forming a first layer of gate material over the gate dielectric;
    etching the first layer of gate material to remove a portion of the first layer of gate material over a first portion of the semiconductor layer and to leave a select gate portion;
    forming a storage layer over the select gate portion and over the first portion of the semiconductor layer;
    forming a second layer of gate material over the storage layer;
    etching the second layer of gate material to remove a first portion of the second layer of gate material over a first portion of the select gate portion; and
    etching out a portion of the first portion of the select gate portion to leave an L-shaped select gate structure, wherein:
       the L-shaped select gate structure has a vertical portion and a horizontal portion;
       the vertical portion has a height and a width; and
       the horizontal portion has a thickness that is less than the height of the vertical portion.

2. The method of claim 1, wherein the step of etching out further comprises removing a portion of the storage layer over the first portion of the select gate structure.

3. The method of claim 1, wherein the step of etching the second layer is further characterized as leaving a second portion of the second layer over the vertical portion and a third portion of the second layer over the first portion of the semiconductor layer.

4. The method of claim 1, further comprising forming a stressor layer over the semiconductor device after the step of etching out.

5. The method of claim 4, further comprising removing a portion of the horizontal portion of the L-shaped select gate structure to form a select gate comprising the vertical portion and a portion of the horizontal portion prior to the step of forming the stressor layer.

6. The method of claim 5, wherein the step of etching the second layer of gate material is further characterized as forming a control gate from the second layer of gate material, the method further comprising implanting to form a first source/drain region in the semiconductor layer adjacent to the select gate and a second source/drain region in the semiconductor layer adjacent to the control gate.

7. The method of claim 6, wherein the step of etching out is further characterized by the thickness of the horizontal layer being sufficiently thick to have implant blocking capability sufficient to prevent implants during the step of implanting if the implants are received directly by the horizontal layer.

8. The method of claim 6, further comprising forming a sidewall spacer spanning the portion of the horizontal portion of the select gate to form a mask during at least a portion of the step of implanting.

9. The method of claim 8, wherein the step of etching out is further characterized by the thickness of the horizontal portion being less than 60 nanometers.

10. The method of claim 6, wherein the step of implanting includes forming sidewall spacers, the method further comprising:
    forming silicide regions at a top surface of the first and second source/drain regions;
    removing the sidewall spacers; and
    forming a stressor layer over the select gate, control gate, and first and second source/drain regions.

11. The method of claim 1, wherein the step of forming the storage layer is further characterized by the storage layer comprising nanocrystals.

12. The method of claim 1, further comprising implanting the first layer of gate material with a dopant for use in making the first layer of gate material conductive.

13. The method of claim 1, wherein the step of etching out is further characterized by the width of the vertical portion being less than 60 nanometers.

14. A semiconductor device, comprising:
    a gate dielectric over a semiconductor layer;
    an L-shaped select gate over the gate dielectric having a horizontal portion having a thickness and a vertical portion having a width and a height, the height greater than the thickness;
    a control gate having a first portion over the vertical portion, a second portion laterally adjacent the vertical portion, and a third portion over the semiconductor layer; and
    a storage layer between the control gate and the select gate and between the control gate and the semiconductor layer.

15. The semiconductor device of claim 14, further comprising a stressor layer laterally adjacent to and over the control gate and laterally adjacent to and over the select gate.

16. The semiconductor device of claim 15, further comprising:
    a first source/drain in the semiconductor layer adjacent to the horizontal portion of the select gate; and
    a second source/drain in the semiconductor layer laterally adjacent to the control gate,
    wherein the stressor layer is over the first and second source/drains.

17. The semiconductor device of claim 14, wherein the thickness of the horizontal portion is sufficiently thick to be able block source/drain implants.

18. The semiconductor device of claim 14, wherein the thickness of the horizontal portion is less than 60 nanometers.

19. A method of making a semiconductor device on a semiconductor layer, comprising:
- forming a select gate portion over the semiconductor layer;
- forming a storage layer having a first portion over the select gate portion and a second portion over the semiconductor layer;
- forming a control gate structure over the storage layer and having a first portion over a first portion of the select gate portion, a second portion laterally adjacent the select gate portion, and a third portion over the semiconductor layer;
- removing a portion of the select gate portion to provide a select gate comprising a vertical portion under the first portion of the control gate and a horizontal portion extending away from the control gate, wherein the horizontal portion has a thickness less than a height of the vertical portion; and
- forming an insulating layer that provides a stress to the semiconductor layer under the control gate and the select gate.

20. The method of claim 19 further comprising:
- forming a first source/drain and a second source/drain in the semiconductor layer, wherein the first source/drain is adjacent to the select gate and the second source/drain is adjacent to the control gate.

* * * * *